United States Patent
Schroeder et al.

(10) Patent No.: US 8,745,858 B2
(45) Date of Patent: Jun. 10, 2014

(54) METHOD FOR APPLYING SOFT SOLDER TO A MOUNTING SURFACE OF A COMPONENT

(75) Inventors: Dominic Schroeder, Warensdorf (DE); Matthias Schroeder, Stadtroda (DE)

(73) Assignee: JEONPTIK Laser GmbH, Jena (DE)

( * ) Notice: Subject to any disclaimer, the term of this patent is extended or adjusted under 35 U.S.C. 154(b) by 0 days.

(21) Appl. No.: 13/578,327

(22) PCT Filed: Feb. 22, 2011

(86) PCT No.: PCT/EP2011/052592
§ 371 (c)(1),
(2), (4) Date: Aug. 10, 2012

(87) PCT Pub. No.: WO2011/104229
PCT Pub. Date: Sep. 1, 2011

(65) Prior Publication Data
US 2012/0297616 A1    Nov. 29, 2012

(30) Foreign Application Priority Data
Feb. 23, 2010 (DE) .......................... 10 2010 002 252

(51) Int. Cl.
*H01R 43/00* (2006.01)
*B23K 35/14* (2006.01)
(52) U.S. Cl.
USPC ............... 29/825; 29/841; 29/842; 228/56.3; 228/124.6
(58) Field of Classification Search
USPC ................. 29/825, 841, 842; 228/56.3, 124.6
See application file for complete search history.

(56) References Cited

U.S. PATENT DOCUMENTS

| 4,332,341 | A | * | 6/1982 | Minetti ................ 228/180.22 |
| 5,591,037 | A |   | 1/1997 | Jin et al. |
| 6,047,876 | A |   | 4/2000 | Smith |
| 7,690,551 | B2 | * | 4/2010 | You Yang ................ 228/56.3 |
| 2005/0156325 | A1 | * | 7/2005 | You Yang ................ 257/779 |
| 2008/0095956 | A1 |   | 4/2008 | Brehm et al. |
| 2010/0032143 | A1 |   | 2/2010 | Datta et al. |

FOREIGN PATENT DOCUMENTS

| DE | 19729587 A1 | 1/1999 |
| JP | 54138371 A | 10/1979 |
| JP | 59220298 A | 12/1984 |
| JP | 9055578 A | 2/1997 |
| JP | 2006205198 A | 8/2006 |

OTHER PUBLICATIONS

English translation of German Patent and Trademark Office examination report dated Nov. 16, 2010, 5 pages.
International Preliminary Report on Patentability for international application PCT/EP2011/052592, Sep. 12, 2012, 10 pages.

* cited by examiner

*Primary Examiner* — Carl Arbes
(74) *Attorney, Agent, or Firm* — Skaar Ulbrich Macari, P.A.

(57) ABSTRACT

The invention relates to a method for applying soft solder to a mounting surface of a component, wherein a connecting means comprising a carrier layer and a soft solder layer formed by physical vapor deposition on the carrier layer is brought into mechanical contact between the soft solder layer and the mounting surface, such that a first bond strength between the soft solder layer and the mounting surface is greater than a second bond strength between the soft solder layer and the carrier layer. The connecting means is subsequently removed from the component so that the carrier layer releases from the soft solder layer in the area of the mounting surface and thus soft solder remains only at the mounting surface.

20 Claims, 3 Drawing Sheets

METHOD FOR APPLYING SOFT SOLDER TO A MOUNTING SURFACE OF A COMPONENT

PRIORITY

This application claims the benefit of International Application PCT/EP2011/052592, filed on Feb. 22, 2011, and German Patent Application No. 102010002252.7-24, filed on Feb. 23, 2010, both of which are hereby incorporated herein by reference in their entirety.

FIELD

The invention relates to improved methods for applying soft solder to a mounting surface of a component.

BACKGROUND

It is known to apply soft solder in the form of a solder paste to a mounting surface of a component. However, neither constant layer thicknesses nor layer thicknesses in the range of ≤10 µm are possible with this process.

Furthermore, soft solder foils can be produced by rolling. However, depending on the composition of the solder, uniform layer thicknesses of less than 20 µm and up to 100 µm can only be achieved with a high degree of complexity. These rolled soft solders can be rolled on a carrier layer or together therewith. However, rolled soft solders are often contaminated during production and may contain undesirable rolling grooves.

To date, therefore, soft solder has been vapor-deposited onto the entire component (masked or unmasked) in order to apply the soft solder to the mounting surface of the component thinly and/or in the purest possible form, since small layer thicknesses combined with a high degree of purity can be achieved in a targeted manner by means of vapor deposition. However, this method is relatively expensive, particularly if the mounting surface is small in relation to the rest of the surface, which may be masked, of the component.

SUMMARY

On the basis of this, it is an object of the invention, therefore, to provide an improved method for applying soft solder to a mounting surface of a component.

The object is achieved by a method for applying soft solder to a mounting surface of a component, in which method a) a connecting means comprising a carrier layer and a layer of soft solder formed on the carrier layer by physical vapor deposition is brought into mechanical contact, by way of the layer of soft solder thereof, with the mounting surface in such a way that a first bond strength between the layer of soft solder and the mounting surface becomes greater than a second bond strength between the layer of soft solder and the carrier layer, and b) the connecting means is then removed from the component, such that the carrier layer is detached from the layer of soft solder in the region of the mounting surface and therefore soft solder remains only on the mounting surface. This makes it possible to locally apply an extremely thin and at the same time very pure layer of soft solder to the mounting surface.

Here, soft solders are understood to mean in particular those solders with a melting point of less than 450° C. In particular, the melting point can lie in the range between 180° C. and 300° C. Furthermore, the soft solder can have a melting point of less than 250° C. The melting point is selected in such a way that, on the one hand, it lies sufficiently above the maximum operating temperature of the components to be soldered to one another, but, on the other hand, it is sufficiently low so that no damage to the components arises during the soldering.

Physical vapor deposition is a coating method (preferably a vacuum-based coating method) in which the layer of soft solder is formed directly by condensation of an appropriate material vapor. It is thus possible to use an evaporation method (e.g. thermal evaporation, electron beam evaporation, pulsed laser deposition, arc evaporation, molecular beam epitaxy, etc.), sputtering methods and/or ion plating.

In the method according to the invention, the layer of soft solder can be pressed against the mounting surface in the region of the mounting surface (preferably with a greater force than outside the mounting surface) in order to achieve the first bond strength (or first adhesion). This can be achieved, for example, by subjecting the back side of the carrier layer to a predetermined mechanical pressure only in the region of the mounting surface.

In the method, the mounting surface can be part of a relatively large surface of the component. Even if the layer of soft solder of the soldering means is also brought into contact with the surface next to the mounting surface, the first bond strength can be achieved, e.g. by local mechanical pressure, only in the region of the mounting surface, such that, when the soldering means is removed, the desired layer of soft solder then remains precisely only in the region of the mounting surface.

After the soft solder has been applied, according to the invention, to the mounting surface, a further component can be brought into mechanical contact with the soft solder on the mounting surface. The two components can be soldered and/or cold-welded by means of the layer of soft solder. It is also possible, however, to merely clamp the two components in such a way that the two components are electrically and thermally contact-connected by means of the layer of soft solder. In this case, it is important that an all-over contact connection is achieved by means of the layer of soft solder, such that the desired electrical and/or thermal transition is present.

In the method, one of the two components may be a heat sink and the other of the two components may be a laser diode. This achieves an outstanding thermal and electrical contact connection between the laser diode and the heat sink.

Furthermore, in the method according to the invention, a second connecting means comprising a carrier layer and a layer of soft solder formed thereon by physical vapor deposition can be brought into mechanical contact, by way of the layer of soft solder thereof, with a second contact surface of a third component in such a way that a third bond strength between the layer of soft solder of the second connecting means and the second mounting surface becomes greater than a fourth bond strength between the layer of soft solder and the carrier layer of the second connecting means, the second connecting means can then be removed from the third component, such that the carrier layer of the second connecting means is detached from the layer of soft solder in the region of the second mounting surface and therefore soft solder remains only on the second mounting surface, and then the second component is brought into mechanical contact with the soft solder on the second mounting surface. It is therefore possible, for example, for a laser diode to be contact-connected with heat sinks from two sides.

In the method according to the invention, each of the carrier layers can be in the form of a non-metallic layer and/or a layer which is not electrically conductive. Furthermore, the respective layer of soft solder may be formed directly on the carrier layer.

It goes without saying that the advantageous method steps for applying the soft solder to the first mounting surface can also be used for applying the soft solder to the second mounting surface. Furthermore, the second connecting means may be the first connecting means which has already been used for applying the soft solder to the mounting surface of the first component.

Provision is furthermore made of a system consisting of a connecting means and a component having a mounting surface, in which system the connecting means comprises a carrier layer and a layer of soft solder which is formed on the carrier layer by physical vapor deposition and can be detached from the carrier layer, wherein the bond strength or adhesion between the layer of soft solder and the carrier layer is lower than between the layer of soft solder and the mounting surface if the connecting means is brought into contact, by way of the layer of soft solder thereof, with the mounting surface. The contacting can be assisted in particular by the application of pressure, such that the layer of soft solder is pressed locally onto the mounting surface.

Such a system makes it possible to apply locally thin layers of soft solder.

The layer thickness of the layer of soft solder is preferably less than or equal to 10 μm.

Furthermore, the layer thickness of the layer of soft solder may be smaller than the layer thickness of the carrier layer, the layer of soft solder preferably being smaller by at least one order of magnitude than the carrier layer.

The layer thickness of the carrier layer can be selected in such a way that it can be referred to as rigid and nevertheless flexible.

The carrier layer may be in the form of a film with a layer thickness in the range of several 100 μm or else smaller. A non-metallic material and/or a material which is not electrically conductive, e.g. polytetrafluoroethylene, polyimide, etc., can be used in particular as the material for the carrier layer.

The layer of soft solder can be formed directly on the carrier layer.

The layer of soft solder can preferably be an indium-containing solder. The solder can additionally contain tin, silver, etc. By virtue of these additional materials, the melting point, for example, and further material properties can be set in a targeted manner.

Furthermore, the layer of soft solder can be formed as a continuous layer on the carrier layer. It is also possible, however, for the layer of soft solder to have portions of soft solder which are spaced apart from one another. It is therefore possible to produce the layer of soft solder such that portions of soft solder adapted to the shape and size of the mounting surface are provided.

It goes without saying that the features mentioned above and the features still to be explained hereinbelow can be used not only in the combinations indicated but also in other combinations or on their own, without departing from the scope of the present invention.

BRIEF DESCRIPTION OF THE DRAWINGS

Hereinbelow, the invention will be explained in more detail, by way of example, with reference to the accompanying drawings, which also disclose features essential to the invention and in which.

DETAILED DESCRIPTION

Figure 1:
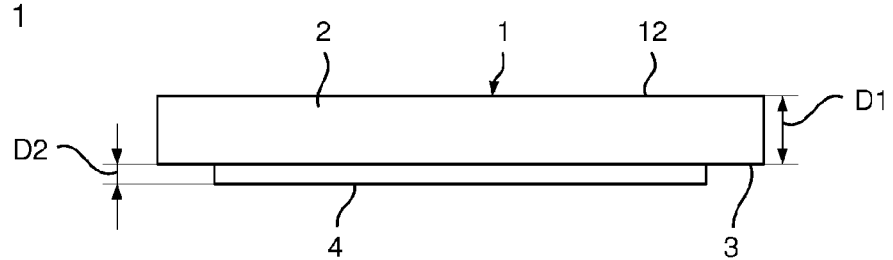
FIG. 1 shows a side view of a first embodiment of a connecting means.
Figure 2:
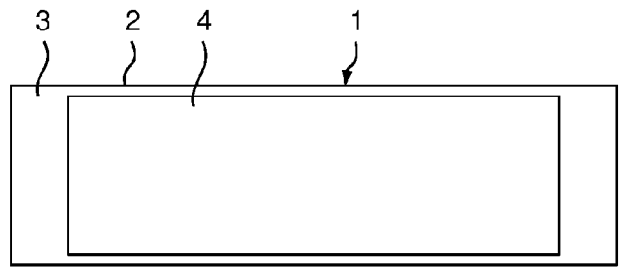
FIG. 2 shows a view of the connecting means shown in FIG. 1 from below.

In the embodiment shown in FIGS. 1 and 2, the connecting means 1 comprises a carrier layer 2 having, on one side (here on the bottom side 3 thereof), a vapor-deposited layer of soft solder 4.

In the embodiment described here, the carrier layer 2 is a Teflon film (polytetrafluoroethylene film) having a thickness D1 in the range of several 100 μm. The layer of soft solder 4 has a thickness D2 which is smaller than the thickness D1 of the carrier layer. The thickness D2 is preferably smaller by at least one order of magnitude than the thickness D1 of the carrier layer 2.

In the exemplary embodiment shown in FIGS. 1 and 2, the layer of soft solder 4 is in the form of indium solder and has a thickness D2 which is less than or equal to 10 μm.

Figure 3:
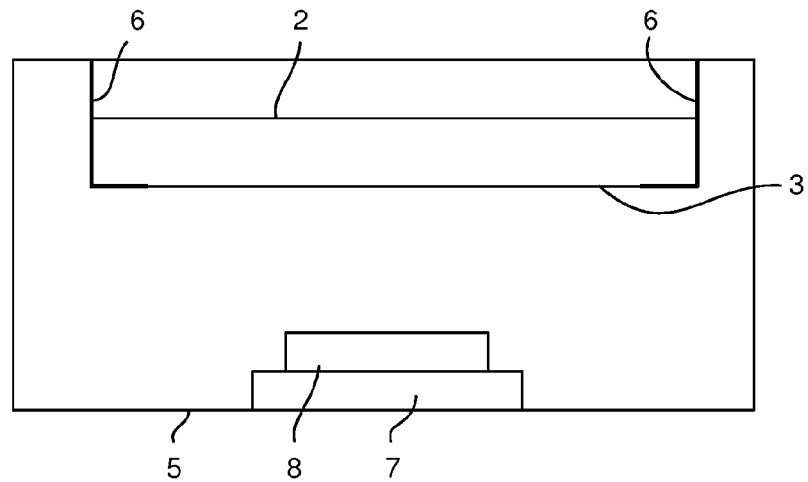
FIG. 3 is a schematic illustration for explaining the production of the connecting means shown in FIGS. 1 and 2.

The connecting means 1 shown in FIGS. 1 and 2 can be produced as follows. The carrier layer 2 is positioned in a chamber 5. As is shown schematically in FIG. 3, it rests on L-shaped holders 6. Furthermore, a heating apparatus 7, on which the soft solder 8 to be vapor deposited lies, is arranged in the chamber 5. The chamber 5 is evacuated and then the soft solder 8 is evaporated by means of the heating apparatus 7, said soft solder thereby being deposited on all the free surfaces on the chamber 5 and therefore also on the bottom side 3 of the carrier layer 2. After a predetermined period of time, the desired thickness D2 of the layer of soft solder 4 is achieved, and the vapor deposition is ended. It goes without saying that a layer thickness measurement can also be carried out, instead of or in addition to the time measurement, in order to ensure that the desired layer thickness of the layer of soft solder is reached.

The evaporation of the soft solder 8 in the chamber 5 can of course be achieved in a very wide variety of ways. In addition to the above-described heating apparatus 7, it is possible, for example, to achieve the desired evaporation by means of an electron beam. In addition to the methods described, it is also possible to use other physical vapor deposition (PVD) methods in order to form the layer of soft solder 4 on the carrier layer 2.

The connecting means 1 is outstandingly suitable for the local application of a thin layer of soft solder (having the thickness D2) to a mounting surface 10 of a component 11. The connecting means 1, together with the component 11, then forms a system according to the invention which consists of the connecting means and the component, the component 11 or at least the region with the mounting surface 10 preferably being formed from an electrically conductive material. The component 11 may be, for example, a heat sink for e.g. a laser diode (not shown), the intention being to solder the laser diode to the mounting surface.

Figure 4:
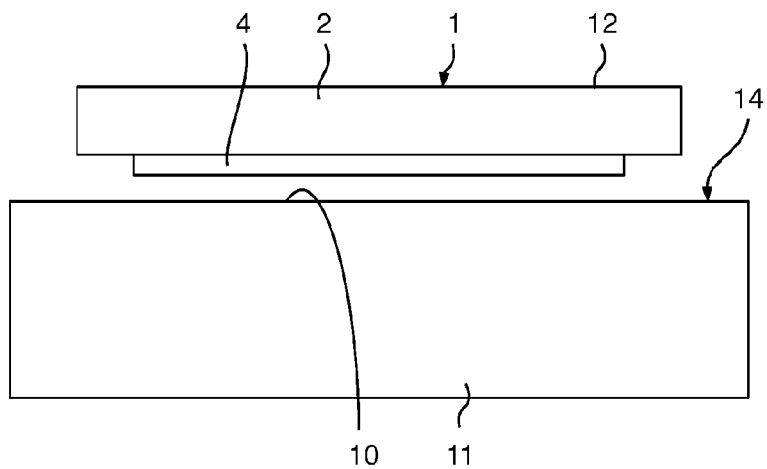
FIGS. 4-6 show side views for describing the application of soft solder to a mounting surface of a component.
Figure 5:
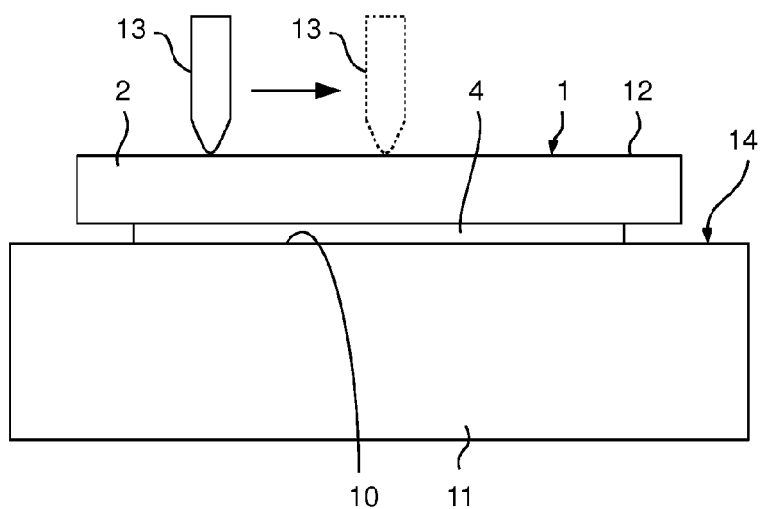

In order to apply the soft solder to the mounting surface 10, the connecting means 1 is placed onto the mounting surface 10 in such a way that the layer of soft solder 4 is in contact with the mounting surface (step from FIG. 4 to FIG. 5). Then, pressure is applied to the top side 12 of the carrier layer 2 in the region which corresponds to the mounting surface 10, as is illustrated schematically in FIG. 5 by a punch 13. In this case, the starting position of the punch 13 is shown by solid lines and the end position of the punch 13 is shown by dashed lines.

Figure 6:
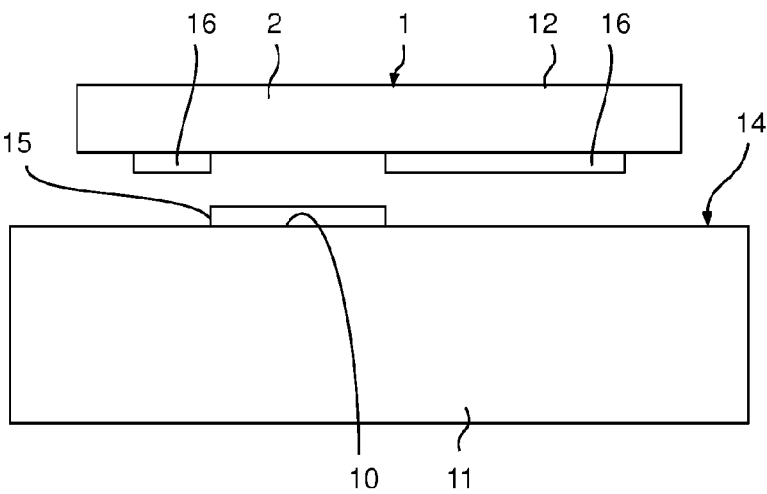
Figure 7:
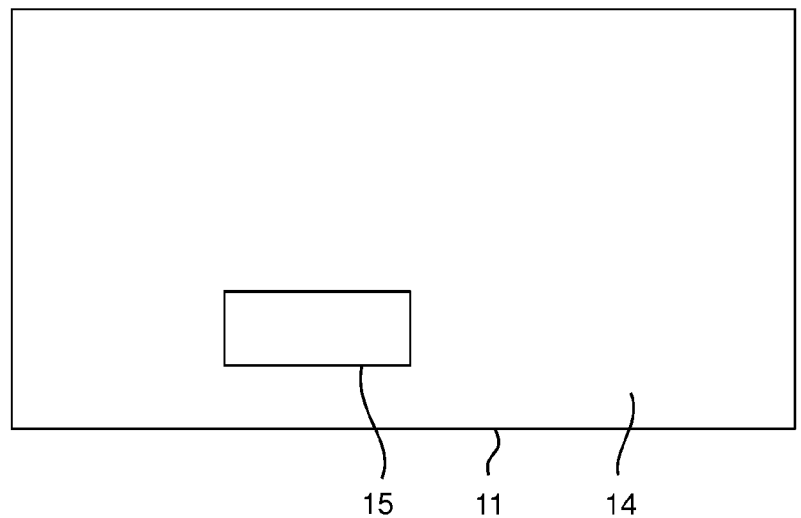
FIG. 7 shows a plan view of the component shown in FIG. 6.

This application of pressure has the effect that the bond strength between the layer of soft solder 4 and the mounting surface 10 becomes greater than the bond strength between the layer of soft solder 4 and the carrier layer 2. Therefore, when the connecting means 1 is removed from the component 11, the soft solder then only remains on the surface 14 of the component 11 as a soft solder coating 15 in the region of the mounting surface 10, as is indicated schematically in FIG. 6. Pressure has not been applied to the soft solder 4 in regions next to the mounting surface 10, and therefore, in these regions of soft solder 16, the bond strength to the carrier layer 2 was greater than to the corresponding surface regions next to the mounting surface 10. Therefore, when the connecting means 1 is raised from the component 11 or from the surface 14 thereof, the soft solder remains on the carrier layer 2 in these regions. In this way, it is possible to achieve a defined local application of the soft solder 4, with the applied soft solder at the same time having an extremely small thickness (here less than or equal to 10 μm). It is therefore possible, in a manner which saves material, to apply the desired soft solder only to the mounting surface region 10, as is evident for example from the plan view of the component 11 with the soft solder coating 15 in FIG. 7.

After the described coating, the further component (e.g. a laser diode) is placed onto the soft solder coating 15 and soldered to the component.

Cold-welding can, of course, also be carried out instead of soldering. Furthermore, it is possible to merely clamp both components, without carrying out soldering or cold-welding. In this case, too, the desired thermal and electrical connection of the two components could be achieved by means of the soft solder.

Furthermore, a third component (e.g. a second heat sink) can be thermally and electrically contact-connected via a layer of soft solder on that side of the further component (e.g. of the laser diode) which faces away from the component 11, in which case the layer of soft solder can be transferred from the carrier layer to the corresponding mounting surface in the manner described.

Figure 8:
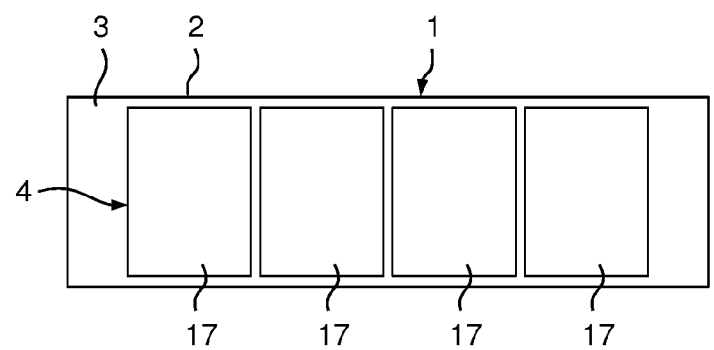
FIG. 8 shows a view of a soldering means according to a further embodiment from below.

In addition to the strip-like formation of the layer of soft solder 4 shown in FIG. 2, it is of course also possible to already produce the desired regions of soft solder during the vapor deposition. To this end, it is merely necessary, for example, to provide corresponding maskings on the bottom side 3 of the carrier layer 2 before the vapor deposition, which are removed after the vapor deposition. It is therefore possible, for example, to produce a plurality of soft solder layer portions 17 which are spaced apart from one another, as is shown schematically in FIG. 8. It goes without saying that any desired forms are possible for the portions of soft solder 17. Furthermore, the carrier layer 2 does not have to have a strip form, as in the case of the exemplary embodiments described. It is also possible to provide other surface forms.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for applying soft solder to a mounting surface of a component, comprising:
   a) providing a connector assembly, the connector assembly comprising a carrier layer and a layer of soft solder formed on one side of the carrier layer by physical vapor deposition;
   b) mechanically contacting, the layer of soft solder to the mounting surface such that the carrier layer is disposed opposite the layer of soft solder when the layer of soft solder contacts the mounting surface, and such that a first bond strength between the layer of soft solder and the mounting surface becomes greater than a second bond strength between the layer of soft solder and the carrier layer, and
   c) removing the connector assembly from the component, such that the carrier layer is detached from at least a portion of the layer of soft solder in the region of the mounting surface, leaving the at least a portion of soft solder on the mounting surface.

2. The method of claim 1, wherein, in step a), the layer of soft solder is pressed against the mounting surface in the region of the mounting surface in order to achieve the first bond strength.

3. The method of claim 1, wherein the mounting surface is a portion of the component surface.

4. The method of claim 1, wherein, in step a), the layer of soft solder is brought into contact with the surface next to the mounting surface.

5. The method of claim 1, further comprising, after step b), bringing a second component into mechanical contact with the soft solder on the mounting surface.

6. The method of claim 5, wherein one of the first and second components is a heat sink and the other of the first and second components is a laser diode.

7. The method of claim 5, further comprising:
   providing a second connector assembly, the second connector assembly comprising a carrier layer and a layer of soft solder formed thereon by physical vapor deposition brought into mechanical contact, by way of the layer of soft solder thereof, with a second contact surface of a third component such that a third bond strength between the layer of soft solder of the second connector and the second mounting surface becomes greater than a fourth bond strength between the layer of soft solder and the carrier layer of the second connector means;
   removing the second connector assembly from the third component, such that the carrier layer of the second connector is detached from the layer of soft solder in the region of the second mounting surface and therefore only soft solder remains on the second mounting surface; and
   bringing the second component is into mechanical contact with the soft solder on the second mounting surface.

8. The method of claim 1, wherein a non-metallic layer is used as the carrier layer.

9. The method of claim 1, wherein the carrier layer is not electrically conductive.

10. The method of claim 1, wherein the layer of soft solder is formed directly on the carrier layer.

11. A system comprising:
a component having a mounting surface; and
a connector assembly, comprising:
   a carrier layer; and
   a layer of soft solder which is formed on the carrier layer by physical vapor deposition and which can be detached from the carrier layer,
wherein a bond strength between the layer of soft solder and the carrier layer is lower than a bond strength between the layer of soft solder and the mounting surface in response to the connector assembly being brought into mechanical contact, by way of the layer of soft solder thereof, with the mounting surface such that the layer of soft solder is disposed between the carrier layer and the mounting surface.

12. The system of claim 11, wherein the thickness of the layer of soft solder is smaller by at least one order of magnitude than the thickness of the carrier layer.

13. The system of claim 11, wherein the layer of soft solder has a layer thickness of less than or equal to 10 μm.

14. The system of claim 11, wherein the layer of soft solder is an indium-containing solder.

15. The system of claim 11, wherein the carrier layer comprises a non-metallic layer.

16. The system of claim 11, wherein the carrier layer is not electrically conductive.

17. The system of claim 11, wherein the layer of soft solder is a continuous layer.

18. The system of claim 11, wherein the layer of soft solder has portions of soft solder which are spaced apart from one another.

19. The system of claim 11, wherein the layer of soft solder is formed directly on the carrier layer.

20. A system comprising:
a component having a mounting surface; and
a connector assembly, comprising an electrically non-conductive carrier layer and a layer of soft solder formed on one side of the carrier layer by physical vapor deposition, the layer of soft solder being detachable from the carrier layer,
wherein a first bond strength is defined between the layer of soft solder and the carrier layer, wherein a second bond strength is defined between the layer of soft solder and the mounting surface, and wherein the first bond strength is lower than the second bond strength when the connector is brought into contact with the mounting surface via the layer of soft solder contacting the mounting surface such that the layer of soft solder is disposed between the carrier layer and the mounting surface.

* * * * *